United States Patent
Chang (10) Patent No.: US 7,804,553 B2
(45) Date of Patent: Sep. 28, 2010

(54) LIQUID CRYSTAL DISPLAY

(75) Inventor: Jong-wong Chang, Cheonan-si (KR)

(73) Assignee: Samsung Electronics Co., Ltd. (KR)

( * ) Notice: Subject to any disclaimer, the term of this patent is extended or adjusted under 35 U.S.C. 154(b) by 259 days.

(21) Appl. No.: 12/173,548

(22) Filed: Jul. 15, 2008

(65) Prior Publication Data

US 2009/0021662 A1    Jan. 22, 2009

(30) Foreign Application Priority Data

Jul. 16, 2007    (KR) .................... 10-2007-0071209

(51) Int. Cl.
G02F 1/136    (2006.01)
G02F 1/133    (2006.01)
G09G 3/36    (2006.01)

(52) U.S. Cl. .................... 349/46; 349/42; 345/100

(58) Field of Classification Search ............. None
See application file for complete search history.

(56) References Cited

U.S. PATENT DOCUMENTS 7,084,848 B2 *    8/2006    Senda et al. ............. 345/92

| | | | |
|---|---|---|---|
| 2004/0155698 A1 * | 8/2004 | Kimura | 327/536 |
| 2006/0077143 A1 * | 4/2006 | Kwon | 345/77 |
| 2008/0122735 A1 * | 5/2008 | Park et al. | 345/4 |
| 2008/0266275 A1 * | 10/2008 | Tsai et al. | 345/204 |
| 2009/0021662 A1 * | 1/2009 | Chang | 349/46 |
| 2009/0278782 A1 * | 11/2009 | Chen | 345/100 |
| 2009/0305461 A1 * | 12/2009 | Akimoto et al. | 438/104 |

* cited by examiner

*Primary Examiner*—Michelle R Connelly Cushwa
(74) *Attorney, Agent, or Firm*—Cantor Colburn LLP (57) ABSTRACT

A liquid crystal display including a LC panel including a first display panel having first to n-th gate lines (n>2) and data lines crossing the gate lines and forming a pixel, and a second display panel which faces the first display panel, the aperture ratio of a first pixel line electrically connected to the first gate line is smaller than that of a second to a n-th pixel line electrically connected to the second to the n-th gate line, respectively, and a gate driver having first and the second pull-down transistors which decrease the voltage of each gate line to a low level, the first and second pull-down transistors are connected to start and end terminals of the each gate line, a width-to-length ratio of a channel of the second pull-down transistor is 0.8 to 3 times as large as that of a channel of the first pull-down transistor.

17 Claims, 11 Drawing Sheets

LIQUID CRYSTAL DISPLAY

This application claims priority to Korean Patent Application No. 10-2007-0071209, filed on Jul. 16, 2007, and all the benefits accruing therefrom under 35 U.S.C §119, the contents of which in its entirety are herein incorporate by reference.

BACKGROUND OF THE INVENTION

1. Field of the Invention

The present invention relates to a liquid crystal display ("LCD").

2. Description of the Related Art

In many LCDs, gate driving integrated circuits ("ICs") are mounted in the form of a tape carrier package ("TCP"), a chip-on-glass ("COG"), or other suitable mounting method, but another conventional method has been explored in search of improved manufacturing costs or product size and design. Specifically, in this conventional method, the gate driving ICs are not used, instead, gate drivers which generate gate signals using amorphous silicon Thin Film Transistors ("a-Si TFTs") are mounted on glass substrates.

Research and development efforts have been make to improve the display quality of LCDs.

BRIEF SUMMARY OF THE INVENTION

The present invention has made an effort to solve the above-stated problems and aspects of the present invention provide a liquid crystal display an improved display quality.

An exemplary embodiment of present invention provides a liquid crystal display which includes a liquid crystal panel including a first display panel having the first to the n-th gate lines (n>2) and a plurality of data lines crossing the first to n-th gate lines and forming a pixel, and a second display panel disposed to face the first display panel, and an aperture ratio of a first pixel line electrically connected to the first gate line is smaller than an aperture ratio of a second to a n-th pixel line electrically connected to the second to n-th gate lines respectively, and a gate driver having the first and second pull-down transistors which decrease the voltage of the each gate line to a low level, the first and the second pull-down thin film transistors are respectively connected to a start terminal and a end terminal of each gate line, a ratio of the width to a length of the channel of the second pull-down thin film transistor ("W/L") is approximately 0.8 to 3 times as large as the ratio of the width to a length of a channel of the first pull-down thin film transistor ("W/L").

Another exemplary embodiment of present invention provides a liquid crystal display which includes a liquid crystal panel including a first display panel having first to n-th gate lines (n>2) and a plurality of data lines crossing the first to n-th gate lines and forming a pixel and a second display panel disposed to face the first display panel; and a gate driver having first to n-th stages respectively supplying first to n-th gate signals (n>2) to the first to n-th gate lines (n>2), the first to n-th stages respectively have a first and a second pull-down thin film transistor which decrease the voltage of the first to n-th gate lines to a low level, each first pull-down thin film transistor is connected to a start terminal of the first to n-th gate lines, each second pull-down thin film transistor is connected to an end terminal of the first to n-th gate lines, wherein a ratio of a width to a length of a channel of the first pull-down thin film transistor ("W/L") of the first stage is approximately 2 to 5 times as large as a ratio of a width to a length of a channel of each second pull-down thin film transistor ("W/L") of the second to n-th stages.

Other embodiments and variations are included in the description and drawings.

BRIEF DESCRIPTION OF THE DRAWINGS

The above and other aspects, features and advantages of the present invention will become apparent from the following detailed description when taken in conjunction with the accompanying drawings, in which.

DETAILED DESCRIPTION OF THE INVENTION

The invention is described more fully hereinafter with reference to the accompanying drawings, in which exemplary embodiments of the invention are shown. The present invention may, however, be embodied in many different forms and should not be construed as being limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Hereinafter, exemplary embodiments of the present invention will be described in detail with reference to the accompanying drawings.

A liquid crystal display according to one exemplary embodiment of the present invention will be described hereinafter in further detail with reference to FIGS. 1 through 8.

Figure 1:
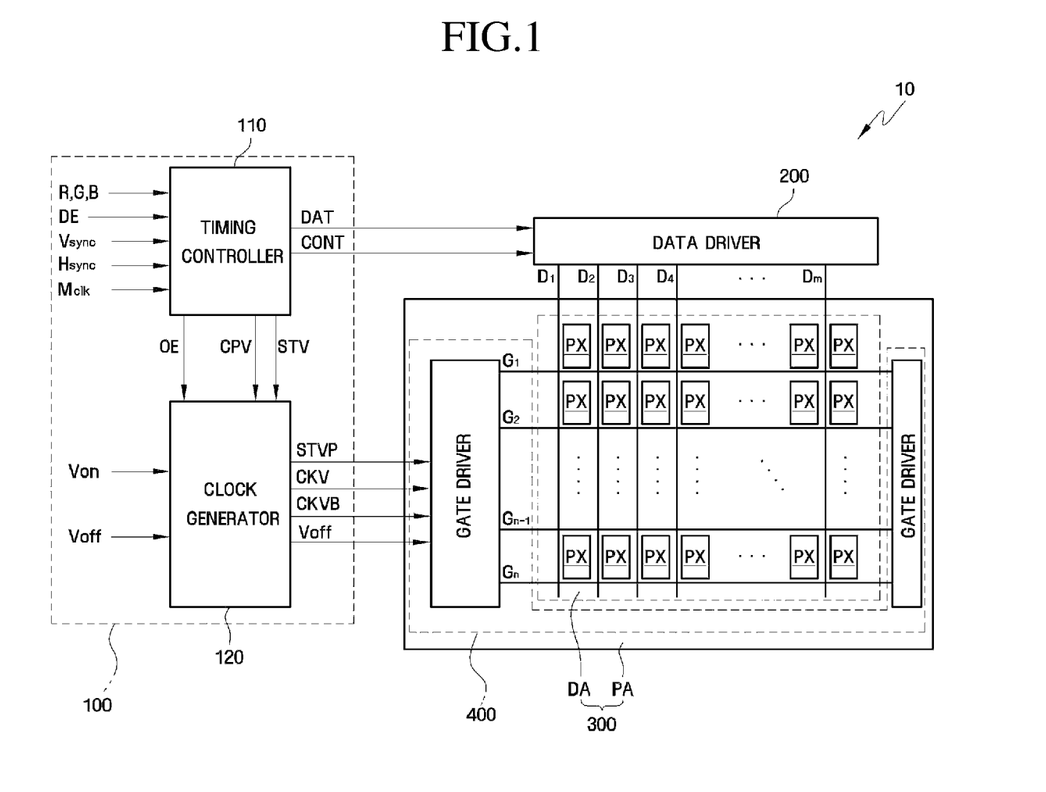
FIG. 1 is a block diagram of an exemplary embodiment of a liquid crystal display according to the present invention.
Figure 2:
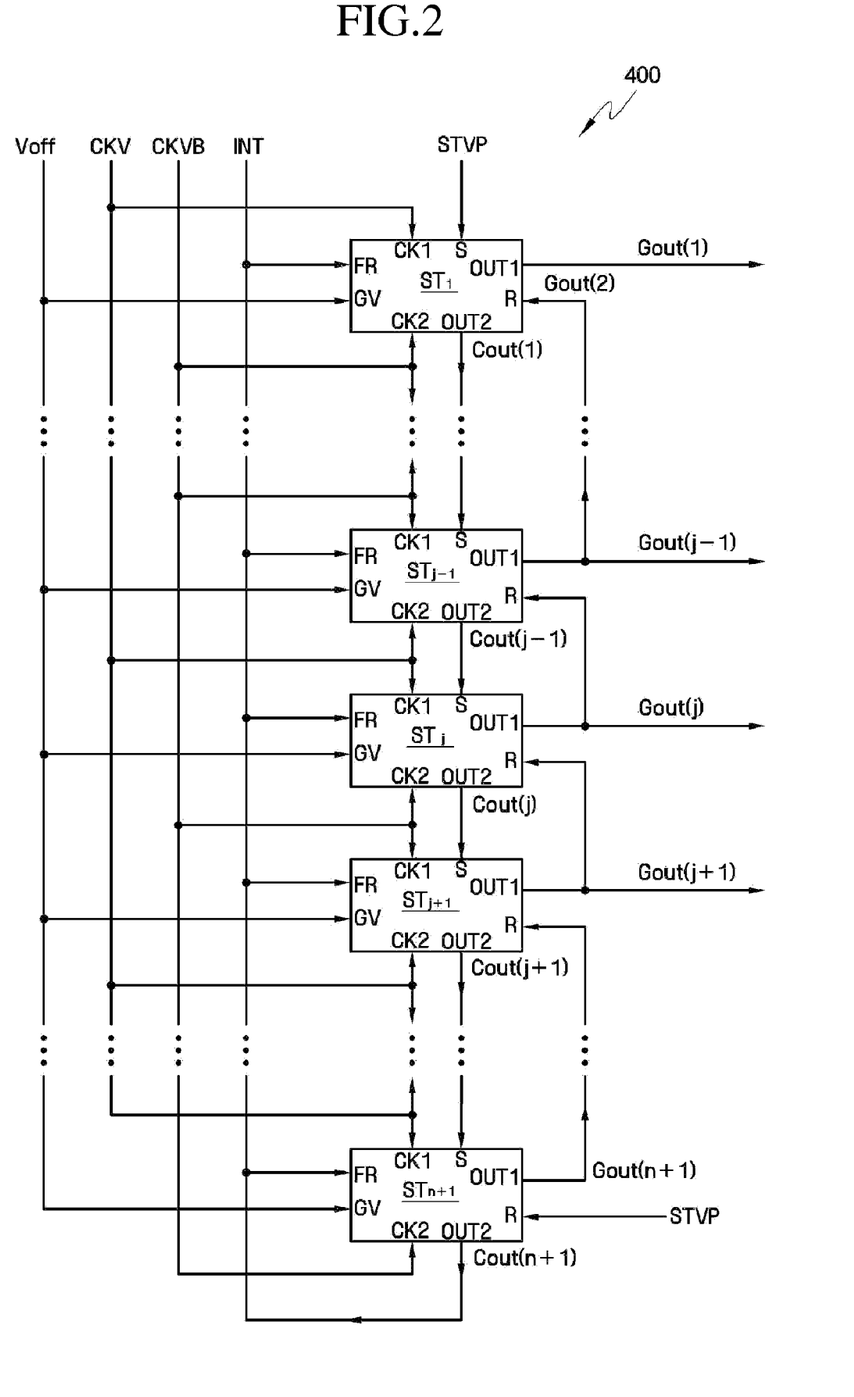
FIG. 2 is a block diagram of an exemplary embodiment of a gate driver of the liquid crystal display of FIG. 1, according to the present invention.
Figure 3:
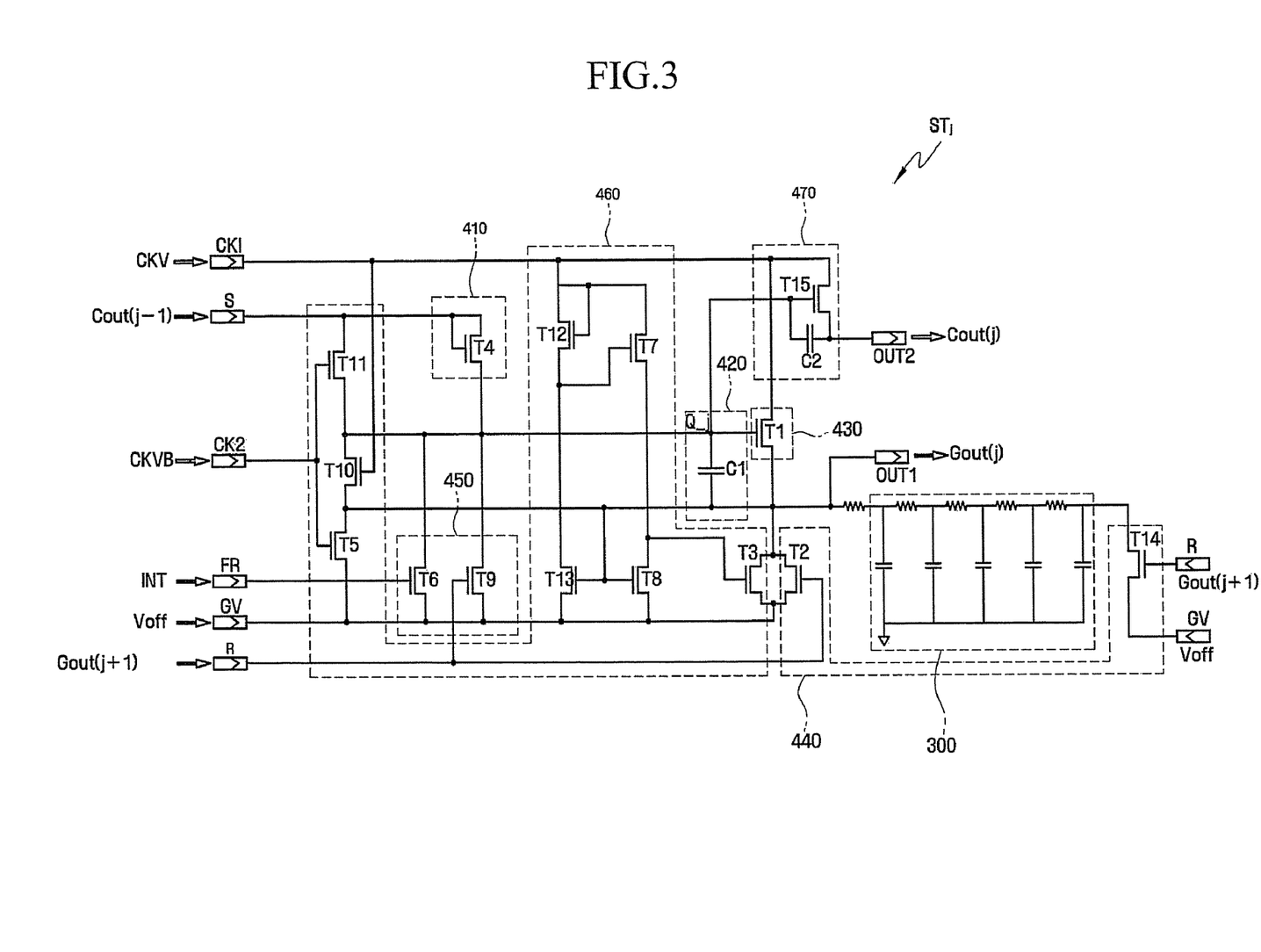
FIG. 3 is a schematic circuit diagram of an exemplary embodiment of a j-th stage of the gate driver of FIG. 2, according to the present invention.
Figure 4:
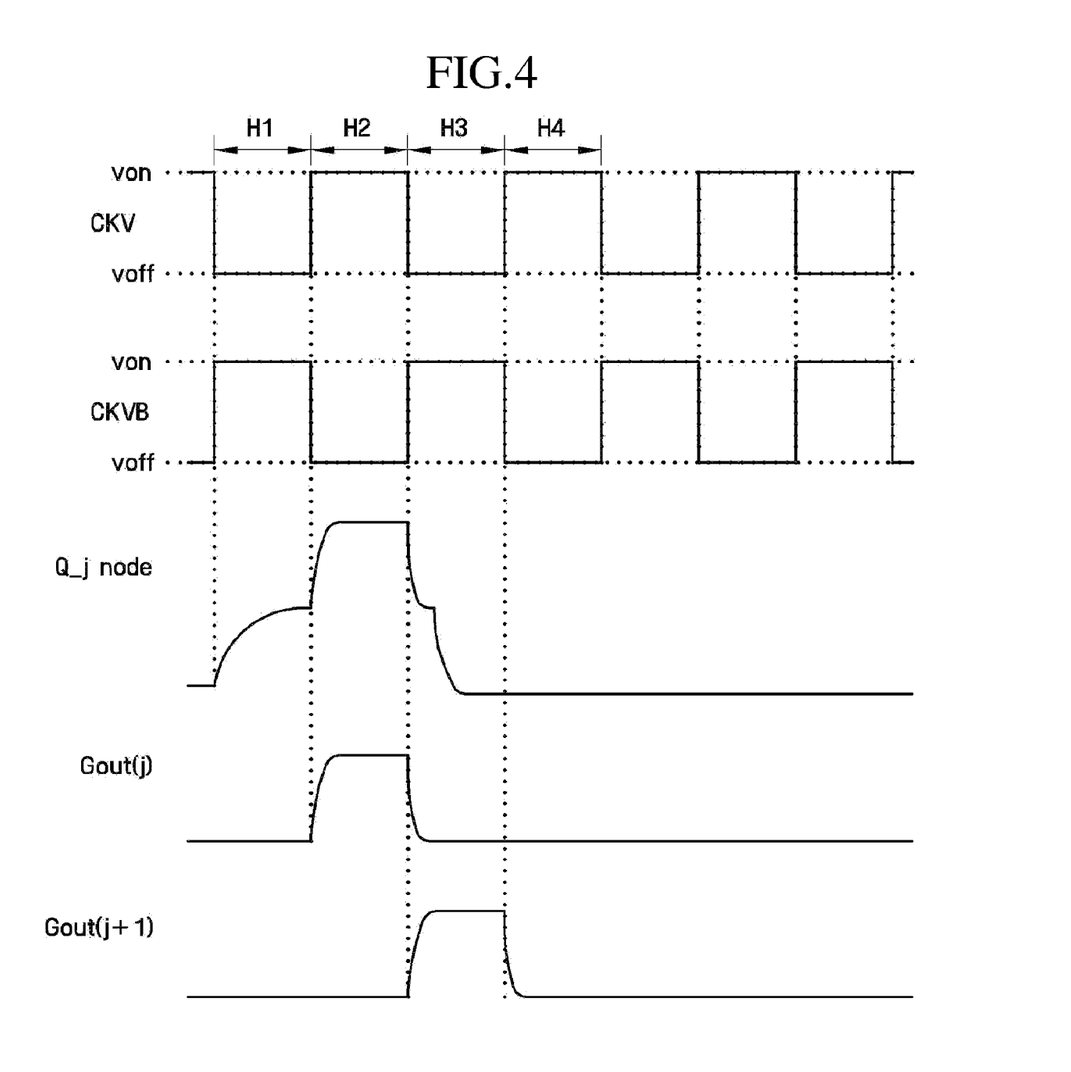
FIG. 4 is a signal-waveform-timing chart illustrating an operation of the j-th stage of the gate driver of FIG. 2 according to one exemplary embodiment of the present invention.
Figure 5:
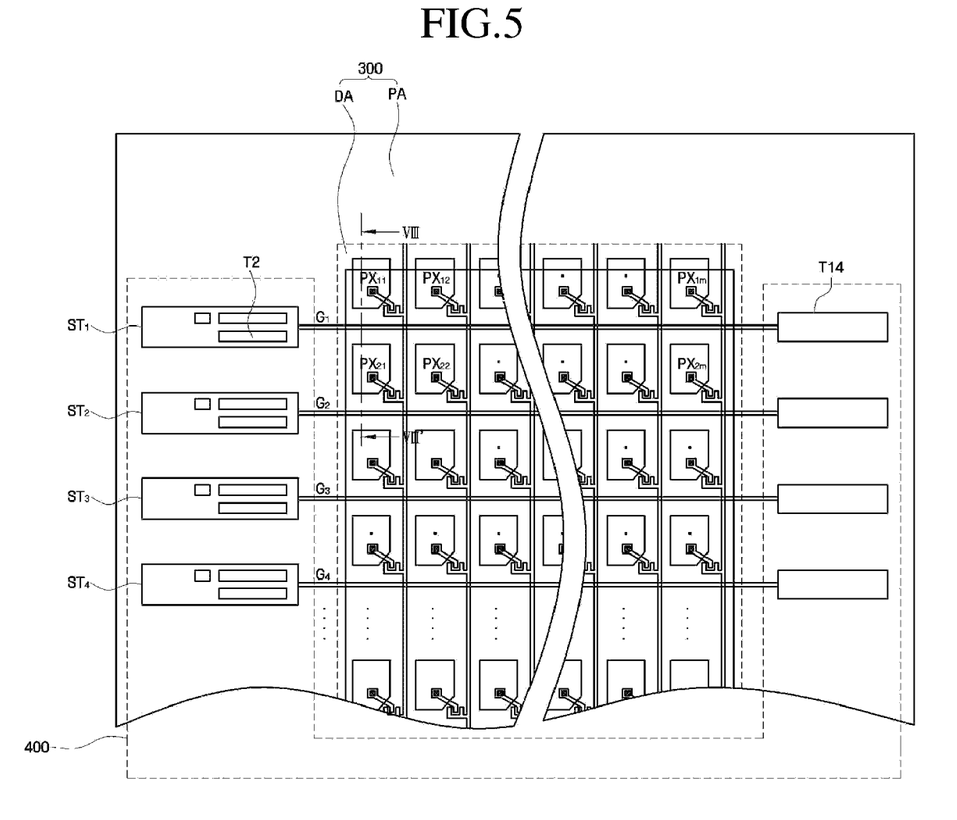
FIG. 5 is an exemplary embodiment of a layout of the liquid crystal display of FIG. 1, according to the present invention.
Figure 6:
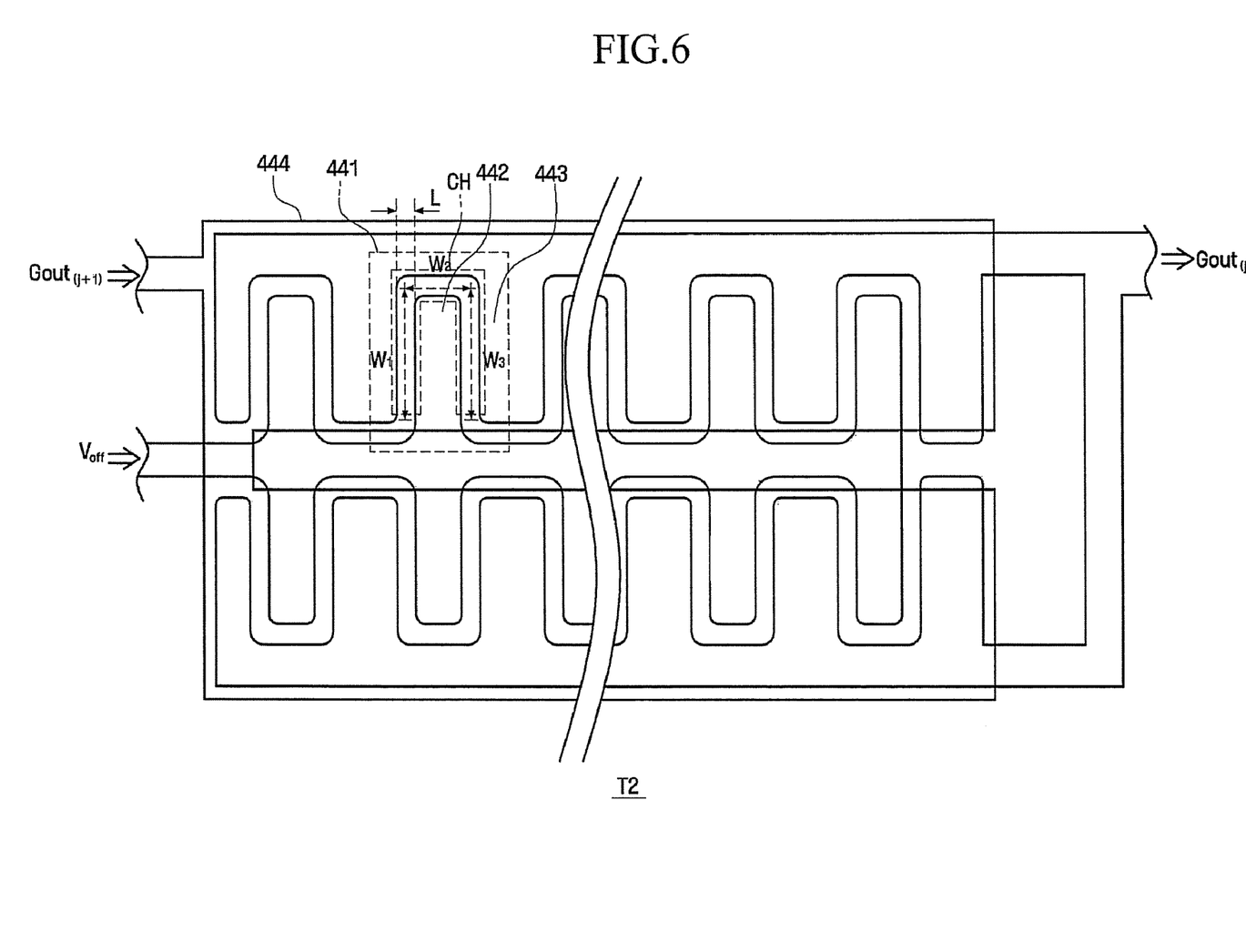
FIG. 6 is an exemplary embodiment of a layout of the first pull-down thin film transistor of FIG. 5, according to the present invention.
Figure 7:
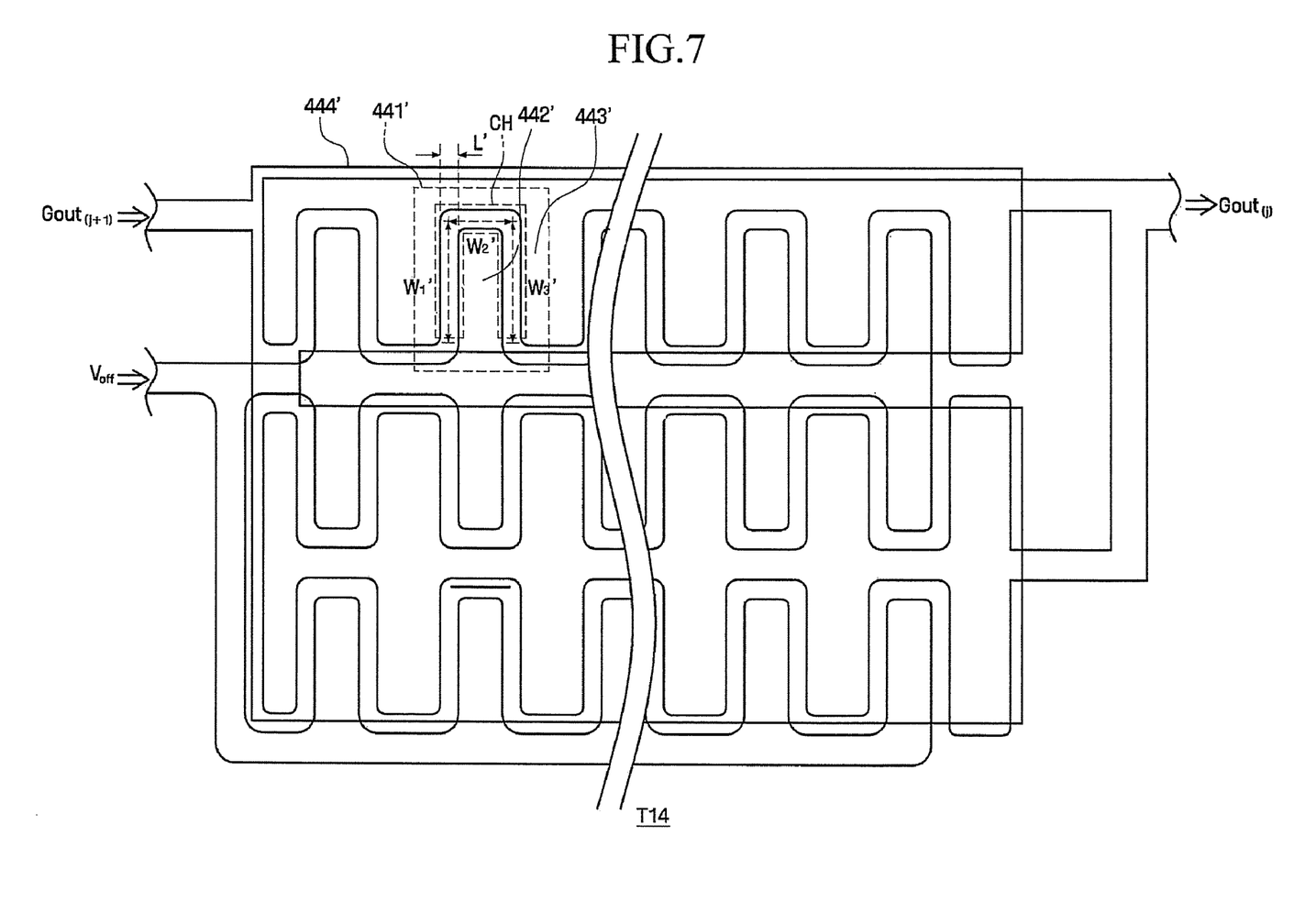
FIG. 7 is an exemplary embodiment of a layout of the second pull-down thin film transistor of FIG. 5, according to the present invention.
Figure 8:
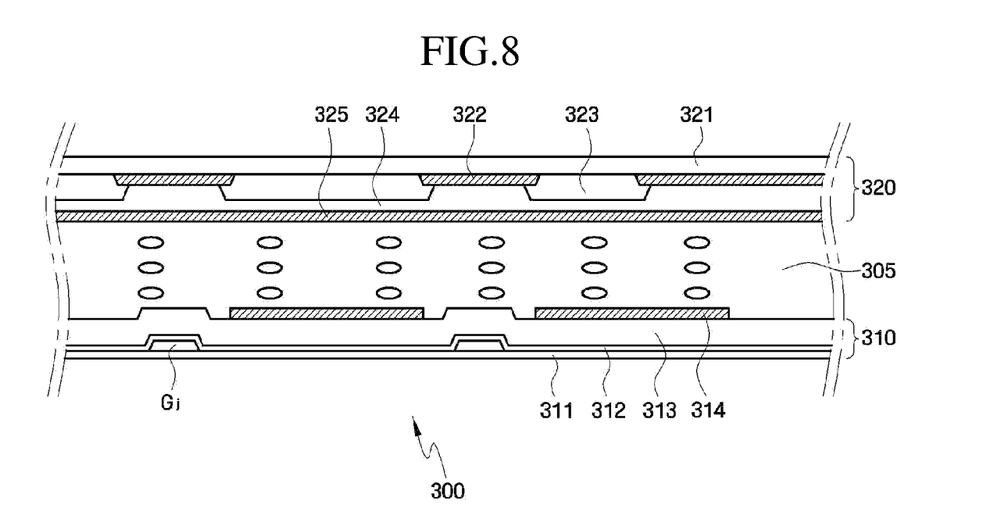
FIG. 8 is a sectional view taken along line VIII-VIII' of FIG. 5.

FIG. 1 is a block diagram of an exemplary embodiment of a liquid crystal display according to the present invention. FIG. 2 is a block diagram of an exemplary embodiment of a gate driver of the liquid crystal display of FIG. 1, according to the present invention. FIG. 3 is a schematic circuit diagram of an exemplary embodiment of a j-th stage of the gate driver of FIG. 2, according to the present invention. FIG. 4 is an exemplary embodiment of a signal-waveform-timing chart illustrating an operation of the j-th stage of the gate driver of FIG. 2, according to the present invention. FIG. 5 is an exemplary embodiment of a layout of the liquid crystal display of FIG. 1, according to the present invention. FIG. 6 is an exemplary embodiment of a layout of the first pull-down thin-film transistor of FIG. 5, according to the present invention. FIG. 7 is an exemplary embodiment of a layout of the second pull-down thin-film transistor of FIG. 5, according to the present invention. FIG. 8 is a sectional view taken along line VIII-VIII' of FIG. 5.

As shown in FIG. 1, a liquid crystal display 10 according to an exemplary embodiment of the present invention, includes a liquid crystal panel 300, a signal supplier 100, a gate driver 400, and a data driver 200. The signal supplier 100 includes a timing controller 110 and a clock generator 120.

The liquid crystal panel 300 is divided into a display area DA where an image is displayed and a non-display area PA that does not display an image.

The display area DA includes a first substrate (not shown) which has first to n-th gate lines $G_1$ to $G_n$ (n>2), first to m-th data lines $D_1$ to $D_m$ (m>2), switching elements (not shown), and pixel electrodes (not shown) formed thereon, a second substrate (not shown) which includes color filters (not shown) and a common electrode (not shown) formed thereon, and a liquid crystal layer 305 interposed between the first substrate (not shown) and the second substrate (not shown), such that an image is displayed. The gate lines $G_1$ to $G_n$ extend in a row direction as to be substantially parallel to one another, and the data lines $D_1$ to $D_m$ extend in a column direction to be substantially parallel to one another.

According to an exemplary embodiment, the non-display area PA is arranged in a region of an outer periphery of the display area DA.

The signal supplier 100 receives input RGB image signals and an input-control signal which controls the displaying of an image from a graphics controller (not shown), and supplies an image signal DAT and a data control signal CONT to the data driver 200. Specifically, the timing controller 110 receives the input-control signal which includes, for example, a horizontal sync signal Hsync, a main clock signal Mclk, and a data enable signal DE, and supplies the data control signal CONT to the data driver 200. The data control signal CONT controls an operation of the data driver 200, and includes, for example, a horizontal start signal which starts the operation of data driver 200 and a load signal which instructs an output of two data voltages, but is not limited thereto.

The data driver 200 receives the image signal DAT and the data control signal CONT, and supplies an image-data voltage corresponding to the image signal DAT to the first to m-th data lines $D_1$ to $D_m$. According to an exemplary embodiment, the data driver 200 is an integrated circuit "IC", and is connected to the liquid crystal panel 300 in a tape carrier package "TCP" manner, but is not limited thereto. According to another exemplary embodiment, the data driver 200 may be formed on the non-display area PA of the liquid crystal panel 300.

Furthermore, the signal supplier 100 receives a vertical sync signal Vsync and the main clock signal Mclk from the graphics controller (not shown), which is located at the outside of the signal supplier 100, and receives a gate on voltage Von and a gate-off voltage Voff from a voltage generator (not shown), and supplies a first scan-start signal STVP, a clock signal CKV, a clock bar signal CKVB, and gate-off voltage Voff to gate driver 400. Specifically, the timing controller 110 supplies a second scan-start signal STV, a first clock generation control signal OE, and a second clock generation control signal CPV to a clock generator 120. The clock generator 120 receives the second scan-start signal STV, and outputs the first-scan start signal STVP. Furthermore, the clock generator 120 receives the first clock generation control signal OE and the second clock generation control signal CPV, and supplies the clock signal CKV and the clock bar signal CKVB. In the current exemplary embodiment, the clock signal CKV is a reverse-phase signal of the clock bar signal CKVB.

The gate driver 400, which is started by the first scan start STVP, generates a plurality of gate signals using the clock signal CKV, the clock bar signal CKVB, and the gate-off voltage Voff, and sequentially supplies the plurality of gate signals to the first to the n-th gate lines $G_1$ to $G_n$, respectively.

The gate driver 400 will be described hereinafter in further detail with reference to FIG. 2. The gate driver 400 includes a plurality of stages $ST_1$ to $ST_{n+1}$ which are connected to one another in a cascade manner, as illustrated in FIG. 3. Each of the stages $ST_1$ to $ST_n$ except for a final stage $ST_{n+1}$ is connected to a respective corresponding gate line of each of the plurality of gate lines $G_1$ to $G_n$, and outputs gate signals $Gout_1$ to $Gout_{(n)}$, respectively. Each of the stages $ST_1$ to $ST_{n+1}$ receives the gate-off voltage Voff, the clock signal CKV, the clock bar signal CKVB, and an initializing signal INT. According to the current exemplary embodiment, the initializing signal INT may be supplied by the clock generator 120.

According to an exemplary embodiment, each of the stages $ST_1$ to $ST_{n+1}$ may include a first clock terminal $CK_1$, a second clock terminal $CK_2$, a set terminal S, a reset terminal R, a power-supply-voltage terminal GV, a frame-reset-terminal FR, a gate-output terminal OUT1, and a carry-output terminal OUT2.

Specifically, and for purposes of further illustration, among the stages $ST_1$ to $ST_{n+1}$, a j-th stage $ST_j$, for example, includes set terminal S to which a carry signal $Cout_{(j-1)}$ of a previous stage $ST_{j-1}$ is input, a reset terminal R to which a gate signal $Gout_{(j+1)}$ of a next stage $ST_{j+1}$ is input, a first clock terminal $CK_1$ and a second clock terminal $CK_2$ to which the first clock signal CKV and the second clock signal CKVB are input, respectively, a power-supply-voltage terminal GV to which the gate-off voltage Voff is input, and a frame-reset terminal FR to which the initializing signal INT or the carry signal $Cout_{(n+1)}$ of a last stage $ST_{n+1}$ is input. The j-th stage $ST_j$ has a gate-output terminal $OUT_1$ through which a gate signal $Gout_1$ is output, and a carry-output terminal $OUT_2$ through which the carry signal $Cout_{(j)}$ is output.

However, the first scan-start signal STVP is input to the set terminal S of the first stage $ST_1$ instead of the carry signal of the previous stage, and the first scan-start signal STVP is input to the reset terminal R of the final stage $ST_{n+1}$ instead of the gate signal of the next stage.

The j-th stage $ST_j$ will be described hereinafter in further detail with reference to FIGS. 3 and 4.

Referring to FIG. 3, the j-th stage $ST_j$ includes a buffer unit 410, a charge unit 420, a pull-up unit 430, a carry-signal generator 470, a pull-down unit 440, a discharge unit 450, and a holding unit 460. The j-th stage $ST_j$ receives the carry signal $Cout_{(j-1)}$ of the previous stage $ST_{j-1}$, the clock signal CKV and the clock bar signal CKVB. As shown in FIG. 4, the clock signal CKV includes a maintenance period H1 and H3 where a clock signal maintains at a low level and a transition period H2 and H4 when a clock signal transits to a high level from a low level and to a low level from a high level.

The buffer unit 410 includes a transistor T4 which is connected to a diode. The buffer unit 410 supplies the carry signal $Cout_{(j-1)}$ of the previous stage $ST_{j-1}$ to the charge unit 420, the carry-signal generator 470, and the pull-up unit 430. The carry signal $Cout_{(j-1)}$ of the previous stage $ST_{j-1}$ is input through the set terminal S.

The charge unit 420 includes a capacitor C1 having one terminal connected to the source terminal of transistor T4, the pull-up unit 430, and the discharge unit 450, and another terminal connected to the gate-output terminal OUT1.

The pull-up unit 430 includes a transistor T1 having a drain terminal connected to the first clock terminal $CK_1$, a gate terminal connected to the charge unit 420, and a source terminal connected to the gate-output terminal OUT1.

According to an exemplary embodiment, the carry-signal generator 470 includes a transistor T15 having a drain terminal connected to the first clock terminal $CK_1$, a source terminal connected to the carry-output terminal OUT2 and a gate terminal connected to the buffer unit 410 and a capacitor C2 having one terminal connected to the gate terminal of the transistor T15 and another terminal connected to the source terminal of the transistor T15.

The pull-down unit 440 decreases the level of the gate signal $Gout_{(j)}$ to that of the gate-off voltage Voff, and includes a first pull-down transistor T2 and a second pull-down transistor T14. The first pull-down transistor T2 includes a drain terminal connected to the source terminal of the transistor T1 and another terminal of the capacitor C1, a source terminal connected to the power-supply-voltage terminal GV, and a gate terminal connected to the reset terminal R. The second pull-down transistor T14 includes a source terminal connected to the power-supply-voltage terminal GV and a drain terminal connected to the j-th gate line Gj of the liquid crystal panel 300.

The discharge unit 450 includes a transistor T9 which discharges the charge unit 420 in response to the gate signal $Gout_{(j+1)}$ of the next stage $ST_{j+1}$ and a transistor T6 which discharges the charge unit 420 in response to the initializing signal INT. The transistor T9 includes a gate terminal connected to the reset terminal R, a drain terminal connected to one terminal of a capacitor C3, and a source terminal connected to the power-supply-voltage terminal GV.

When the gate signal $Gout_{(j)}$ transits to the high level from the low level, the holding unit 460, which includes a plurality of transistors T3, T5, T6, T7, T8, T10, and T11, holds the gate signal $Gout_{(j)}$ at the high level. When the gate signal $Gout_{(j)}$ transits to the low level from the high level, the holding unit 460 holds the gate signal $Gout_{(j)}$ at the low level during one frame regardless of the voltage level of the clock signal CKV and clock bar signal CKVB.

The operations of units described above will be described hereinafter in further detail with reference to FIGS. 3 and 4.

First, the process in which the gate signal $Gout_{(j)}$ transits to the gate on voltage Von from the gate-off voltage Voff will be described.

The charge unit 420 receives the carry signal $Cout_{(j-1)}$ of the previous stage $ST_{j-1}$, and is charged. That is, during the first maintenance period H1, the charge unit 420 receives the carry signal $Cout_{(j-1)}$ of the previous stage $ST_{j-1}$ and is charged, and the level of the voltage of the node Q_j gradually increases. During the transition period H2, when the clock signal CKV, which is transited to the high level is input, because of the transistor T1 and parasitic capacitor (not shown), the level of the voltage of the node Q_j increases again.

When the voltage of the charge unit 420, that is the voltage of the node Q_j, increases to a first level (for example, see FIG. 4), the transistor of the pull-up unit 430 is turned on and supplies the clock signal CKV, which is input through the first clock terminal $CK_1$, to the gate-output terminal OUT1. Here, the gate signal $Gout_{(j)}$ is the clock signal CKV. That is, the level of the gate signal $Gout_{(j)}$ is that of the gate on voltage Von.

Further, the transistor of the carry-signal generator 470 is turned on, and supplies the clock signal CKV to the carry-output terminal OUT2. Here, the carry signal $Cout_{(j)}$ is the clock signal CKV.

The process in which the gate signal $Gout_{(j)}$ transits to the gate-off voltage Voff from the gate on voltage Von according to an exemplary embodiment of the present invention is described as follows.

During the first transition period H2, when the clock signal CKV transits to the low level from the high level, because of the para-capacitor (not shown), the voltage of the node Q_j decreases. Here, when the gate signal $Gout_{(j+1)}$ of the next stage $ST_{j+1}$ is at the high level, the transistor of the discharge unit 450 is turned on and supplies the gate-off voltage Voff to the node Q_j. However, the clock bar signal CKVB transits to the high level from the low level, the transistor T11 of the holding unit 460 is turned on and supplies the carry signal $Cout_{(j-1)}$ of the previous stage $ST_{j-1}$ to the node Q_j. According to the current exemplary embodiment, the carry signal $Cout_{(j-1)}$ of the previous stage $ST_{j-1}$ is a positive voltage. Therefore, even when the discharge unit 450 supplies the gate-off voltage Voff to the node Q_j, the voltage of the node Q_j is not quickly decreased to the gate-off voltage Voff. But, as illustrated in FIG. 4, the voltage of the node Q_j slowly decreased to the gate-off voltage Voff.

That is, when the gate signal $Gout_{(j+1)}$ of the next stage $ST_{j+1}$ is at the high level, the transistor T1 of the pull-up unit 430 is not turned off and supplies the clock signal CKV, which is at low level to the gate signal $Gout_{(j)}$, and the first and the second pull-down transistor T2, T14 of pull-down unit 440 supplies the gate-off voltage to the gate lines. Because the pull-down unit 440 decreases the gate signal $Gout_{(j)}$ down to the gate-off voltage Voff, and the pull-up unit 430 supplies the clock signal CKV, which is at the low level of the gate signal $Gout_{(j)}$, to the gate-output terminal OUT1, the level of the gate signal $Gout_{(j)}$ decrease to the level of the gate-off voltage Voff. Therefore, the gate signal $Gout_{(j)}$ is not overlapped with the gate signal $Gout_{(j+1)}$ of the next stage $ST_{j+1}$.

An operation that holds the gate signal $Gout_{(j)}$ to the gate-off voltage Voff during one frame after the gate signal $Gout_{(j)}$ decreases to the gate-off voltage Voff according to an exemplary embodiment of the present invention is described as follows.

When the gate signal Gout(j) decreases to the gate-off voltage Voff, the transistors T8 and T13 are turned on. The transistor T13 turns off the transistor T7, so that the transistor T13 prevents a high level of a clock signal CKV from being applied to the transistor T3, and the transistor T8 turns off the transistor T3. Therefore, the gate signal $Gout_{(j)}$ is held at the high level.

Next, the transistors T8 and T13 are turned off, after the gate signal Gout(j) is transited to the low level from the high level. When the clock signal CKV is at the high level, the transistors T7 and T12 turn on the transistor T3, so that the transistors T7 and T12 hold the gate signal Gout(j) at the low level. Further, the transistor T10 is turned on, so that the gate of the transistor T1 is held at the low level, Therefore, the high level of the first clock signal CKV is not output to the gate-output terminal OUT1.

The first clock bar signal CKVB is at the high level, the transistors T5 and T11 are turned on. The transistor T5, which is turned on, holds the gate signal Gout(j) at the low level, the transistor T11, which is turned on, holds one terminal of the capacitor C1 at the low level. Therefore, the gate signal Gout (j) is held at low level during one frame.

According to an exemplary embodiment, the j-th stage STj may not include the carry-signal generator 470. Therefore, in this exemplary embodiment, the j-th stage STj receives the gate signal $Gout_{j-1}$, instead of the carry signal $Cout_{(j-1)}$ of the previous stage $ST_{j-1}$, through the set terminal S, and is operated.

The liquid crystal panel 300, included in the liquid crystal display 10 according to an exemplary embodiment of the present invention, will be described hereinafter in further detail with reference to FIGS. 5 through 8.

Referring to FIGS. 5 and 8, the liquid crystal panel 300 includes the display area DA and the non-display area PA, and the gate driver 400 is mounted in the non-display area PA.

According to an exemplary embodiment, the gate driver 400 is connected to a start terminal of each gate line G1 to Gn, and is formed in the non-display area PA near the start terminal of each gate line G1 to Gn. Further, according to an exemplary embodiment, the gate driver 400, as illustrated in FIG. 5, is connected with both terminals, divided into two parts, and is formed in the non-display area PA near both terminals of each gate line G1 to Gn.

The gate driver 400 includes the plurality of the transistors T1 to T15, and the plurality of capacitors C1 and C2. The plurality of the transistors T1 to T15 and the plurality of capacitors C1 and C2 are included in the buffer unit 410, the charge unit 420, the pull-up unit 430, the carry-signal generator 470, the pull-down unit 440, the discharge unit 450, and the holding unit 460 (shown in FIG. 3, for example). The plurality of the transistors T1 to T15 and the plurality of capacitors C1, C2 are formed in a thin film manner. The thin film transistors are included in the display area DA, and are formed with the plurality of the transistors T1 to T15 and the plurality of capacitors C1 and C2 the same.

Furthermore, when the space of the non-display area PA is insufficient, the gate driver 400 having the plurality of the transistors T1 to T15 and the plurality of capacitors C1 and C2 may be separated.

Particularly, the pull-down unit 440 includes the first and second pull-down transistors T2 and T14, which are electrically connected to the both terminal of each gate line G1 to Gn. Therefore, as illustrated in FIG. 5, the pull-down unit 440 may be formed in the non-display area PA, at a circumference of both terminals of the each gate line G1 to Gn.

The first and second pull-down transistors T2 and T14 are thin film transistors which have source electrodes 443 and 443' and drain electrodes 442 and 442' corresponding to source electrodes 443 and 443', and are formed in the non-display area PA. The source electrodes 443 and 443' and the drain electrodes 442 and 442' are separated, such that a gap for forming a channel CH is formed between the source electrodes 443, 443' and the drain electrodes 442, 442'. For enlarging the width of the channel, the source electrodes 443, 443' and the drain electrodes 442, 442' are a prominence and a depression in shape. Further, a plurality of prominence-and-depression units 441 and 441' are formed in the source electrodes 443 and 443' and the drain electrodes 442 and 442' in order to maximize the width of the channel CH.

The channel CH is formed between the source electrodes 443, 443' and the drain electrodes 442, 442', and is a passage which can move in. The channel CH is operated by the gate signal $Gout_{(j)}$ which is applied to the gate electrode 444, 444'.

Here, the length L of the channel CH is the perpendicular distance between the source electrodes 443 and 443' and the drain electrodes 442 and 442', and the width W of the channel CH is the length of a centerline of the channel CH. The centerline of the channel CH is parallel to the source electrodes 443 and 443' and the drain electrodes 442 and 442'.

The width of the channel $W_{1/n}$, in one of the prominence-and-depression units 441, 441', is $W_1+W_2+W_3$, the sum of the width of channel CH which is formed along an outside of the source electrodes 443, 443' and the drain electrodes 442, 442'. That is, the width ($W_{1/n}=W_1+W_2+W_3$) of the channel CH of one prominence-and-depression unit 441, 441' times the number of prominence-and-depression units 441 and 441' is the width ($W=W_{1/n} \times n$) of the channel CH.

In thin film transistors, which include the plurality of the prominence-and-depression unit 441, 441' like the first and second pull-down transistors, the ratio of the width to the length of the channel of the thin film transistor (W/L) is an essential factor influencing the efficiency of the thin film transistors.

Referring to FIGS. 6 and 7, in the first and second pull-down transistors T2 and T14, the ratio of the width W of the channel CH to the length L of the channel CH of the thin film transistor (W/L) may be different each other. That is, the ratios of the width W to the length L of the channel CH of the thin film transistor (W/L) may be identical each other. But, when the size of the gate driver 400 is considered, the ratio of the second pull-down transistor T14 may be approximately 0.8 to 3 times as large as the ratio of the first pull-down transistor T2.

As described above, the width-to-length ratio of the channel CH of the second pull-down transistor T14 may be approximately 0.8 to 3 times as large as the width-to-length ratio of channel CH of the first pull-down transistor T2, that may be defined in the first stage which supplies the gate signal $Gout_1$ to the first gate line G1. That is, the ratio of the width to the length of the channel CH of the first and the second pull-down transistors T2 and T14 of the first stage $ST_1$ may be adjusted as described above, and the width-to-length ratios of the channel of the first and the second pull-down transistors T2 and T14 of the second to the n-th stage $ST_2$ to $ST_n$ may be adjusted in different ratio to the above.

Further, when the pull-down unit 440 pulls the gate signal $Gout_{(j)}$ down to the gate-off voltage Voff, the pull-up unit 430 also may supply the low level clock signal CKV to the gate signal $Gout_{(j)}$. Therefore, the voltage level of the gate signal $Gout_{(j)}$ promptly decreases to the gate-off signal Voff. At this time, the carry signal $Cout_{(j-1)}$ of the previous stage $ST_{j-1}$ is supplied to the set terminal S of the j-th stage $ST_j$, so that the signal may applied to the pull-up unit 430. The carry-signal generator 470 of the previous stage $ST_{j-1}$ includes the transistor T15. The transistor T15 refers to a delay effect of the predetermined signal, so that the delay effect refers to times when the low level of the clock signal CKV applied to the gate signal $Gout_{(j)}$.

However, in the first stage $ST_1$, when the first scan-start signal STVP is applied to the set terminal S, the delay effect is not referred, so that the voltage of the first gate line G1 is not decreased to the gate-off voltage Voff, and light leakage may occurring liquid crystal panel 300. However, in the liquid crystal display 10 according to an exemplary embodiment of the present invention, the first and second pull-down transistors T2, T14 and an aperture ratio of the pixel are adjusted, so that the light leakage is prevented.

A layout of the liquid crystal panel 300 according to an exemplary embodiment of the present invention will be described hereinafter in further detail with reference to FIG. 8. The liquid crystal panel 300 includes a first display panel 310 which includes a pixel electrode 314 formed thereon, a second display panel 320 including a common electrode 325 formed thereon, and a liquid crystal layer 305 which is interposed between the first display panel 310 and the second display panel 320.

The gate line Gj is formed on a first insulating substrate 311, a gate-insulating layer 312 and a passivation layer 313 are orderly formed on the gate line Gj. Subsequently, the pixel electrode 314 is formed on the passivation layer 313, so that the first display panel 310 is formed.

Further, a black matrix 322 which prevents the light from leaking and a color filter 323, which converts the light, are formed on a second insulating substrate 321, and an over-coat layer 324 and the common electrode 325 are sequentially formed on the black matrix 322 and the color filter 323, so that the second display panel 320 is formed.

The light supplied from under the first display panel 310 is controlled by the pixel electrode 314 formed on the first display panel 310 and the common electrode 325 formed on the second display panel 320. An area where the light is transmitted is a pixel area PX.

The pixel area PX is defined and controlled by the first to the n-th gate lines G1 to Gn and the first and the m-th data lines. Each of the gate lines G1 to Gn can control the pixel area which is disposed in a column direction. In the current exemplary embodiment, a pixel line is defined as the pixels which are controlled on or off by each gate line G1 to Gn. That is, a first pixel line $PX_{11}$ to $PX_{1m}$ is the pixel area PX, which is connected to the first gate line G1, is controlled by the first gate signal $Gout_{(1)}$ is supplied to the first gate line G1 and is a first column of the liquid crystal panel 300. Further, second to n-th pixel line $PX_{21}$ to $PX_{nm}$ is defined as the pixels which are controlled by the second to n-th gate lines G2 to Gn In the liquid crystal display 10 according to an exemplary embodiment of the present invention, an aperture ratio of the first pixel line $PX_{11}$ to $PX_{1m}$ is smaller than an aperture ratio of the second to n-th pixel line $PX_{21}$ to $PX_{nm}$. Particularly, the aperture ratio of the first pixel line $PX_{11}$ to $PX_{1m}$ is approximately 30 to 90 percent that of the second to the n-th pixel line $PX_{21}$ to $PX_{nm}$. At is time, the aperture ratio of the first pixel line $PX_{11}$ to $PX_{1m}$ is 30 to 50 percent of the aperture ratio of the second to the n-th pixel line $PX_{21}$ to $PX_{nm}$, when the dots per inch (DPI) of the pixel is less than approximately 110. In contrast, the aperture ratio of the first pixel line $PX_{11}$ to $PX_{1m}$ is approximately 50 to 90 percent that of the aperture ratio of the second to n-th pixel line $PX_{21}$ to $PX_{nm}$, when the dots per inch (DPI) of the pixel is more than approximately 110.

According to an exemplary embodiment, the pixel area PX is defined by an area which the pixel electrode 314 controlling the liquid crystal layer 305 in the pixel and the common electrode 325 are overlapped at, and an opening area of the black matrix 322. Therefore, in the liquid crystal display 10 according to one exemplary embodiment of the present invention, in order to reduce the aperture ratio of the first pixel line $PX_{11}$ to $PX_{1m}$, a part of the pixel electrode 314 is screen by the black matrix 322.

That is, the black matrix 322 overlaps part of the pixel electrode 314, so that the pixel area PX transmits or screens the quantity of the light needed. Like this, when the black matrix 322 overlaps part of the pixel electrode 314, the aperture ratio of one pixel line is adjusted at once, so that the luminance of light radiated is controlled. When the luminance of one or more pixel lines is not easily controlled by the gate driver 400, the above way may be used.

Further, since the black matrix 322 is a borderline of the non-display area PA, the upper area of the first pixel line $PX_{11}$ to $PX_{1m}$ may be reduced. However, the shape of black matrix 322 is not limited to the above. According to an exemplary embodiment, if the luminance of the pixel area can be controlled by overlapping the black matrix 322 and the pixel area, the black matrix 322 may be a stripe shape crossing the pixel line.

Figure 9:
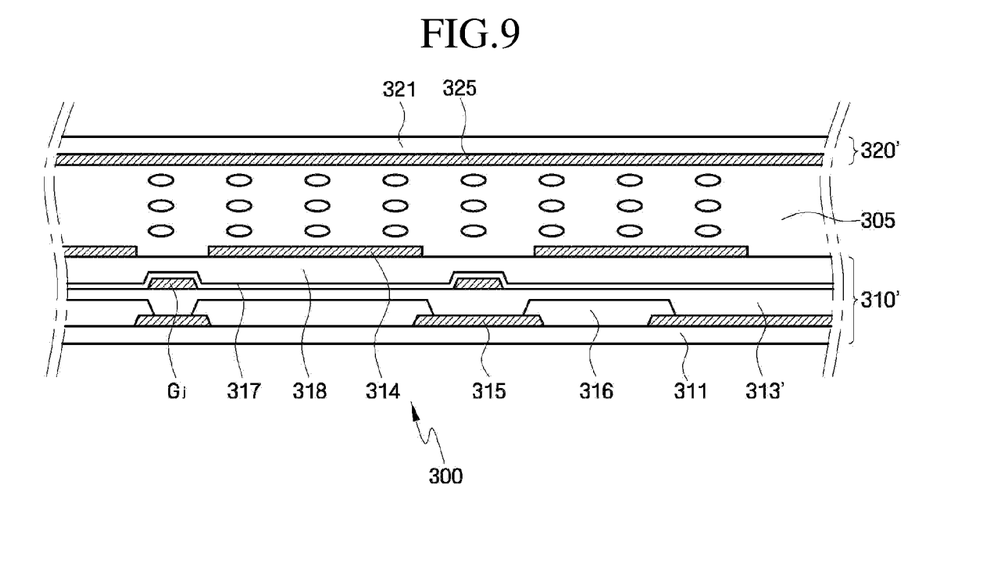
FIG. 9 is a sectional view illustrating another exemplary embodiment of a liquid crystal display according to the present invention.

A liquid crystal display 10 according to another exemplary embodiment of the present invention will be described hereinafter in further detail with reference to FIG. 9. FIG. 9 is a sectional view showing liquid crystal display according to another exemplary embodiment of the present invention.

The liquid crystal display 10 according to another exemplary embodiment of the present invention is a modified embodiment where the aperture of ratio of the first pixel line $PX_{11}$ to $PX_{1m}$ is adjusted by a black matrix 315 which is formed on a first display panel 310'.

The black matrix 315 and the color filter 316 are sequentially formed on the first insulating substrate 311, a first passivation layer 313' is formed on the black matrix 315 and the color filter 316. The black matrix 315 prevents the light from leaking, so that the light supplied from under the first display panel 310' can only able to be transmitted through the pixel area PX. The aperture ratio of the pixel area PX may be adjusted by the layout of the black matrix 315. That is, the size of the first pixel line $PX_{11}$ to $PX_{1m}$ is reduced, so that the aperture ratio of the first pixel line $PX_{11}$ to $PX_{1m}$ is smaller than the aperture ratio of the second to the n-th pixel line $PX_{21}$ to $PX_{nm}$.

Further, according to the current exemplary embodiment, the gate line Gj is formed on the first passivation layer 313', and a gate insulating layer 317 and a second passivation layer 318 is formed in the gate line Gj. Subsequently, the pixel electrode 314 is formed on the second passivation layer 314, so that the first display panel 310 is formed.

As described above, when the black matrix 315 is formed on the first display panel 310 in order to reduce the aperture ratio of the first pixel line $PX_{11}$ to $PX_{1m}$, the aperture ratio is adjusted accurately to the desired condition. That is, even if an align error occurs in the process, the aperture ratio of each pixel line PX is maintained.

Figure 10:
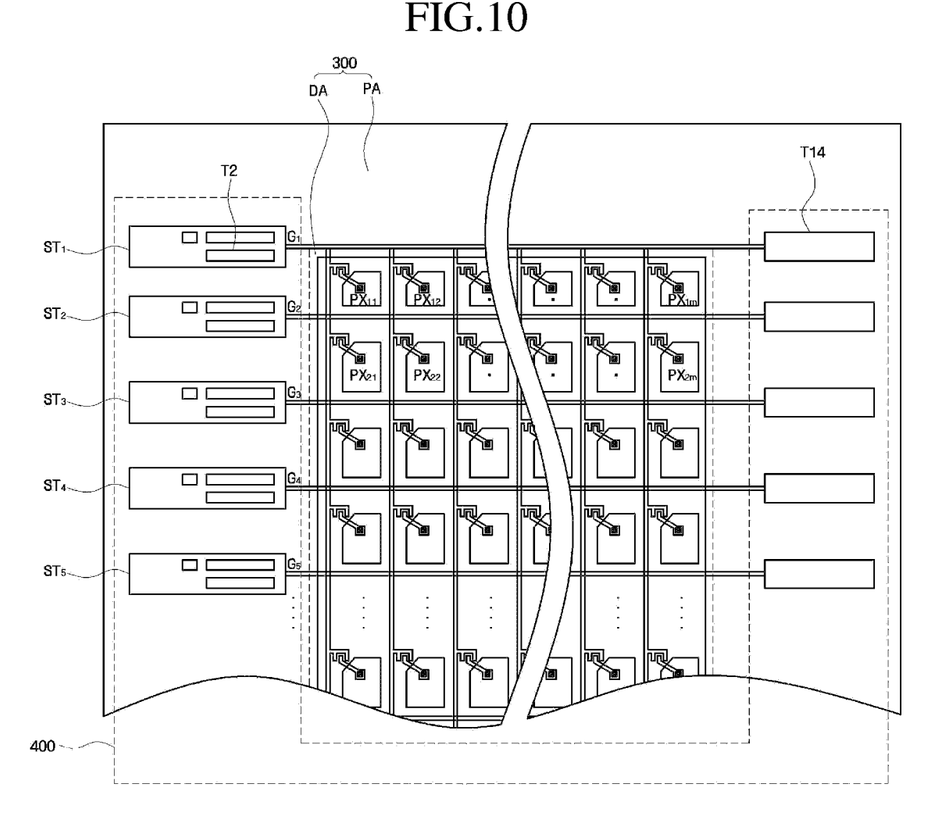
FIG. 10 is another exemplary embodiment of layout of the liquid crystal display according to the present invention.
Figure 11:
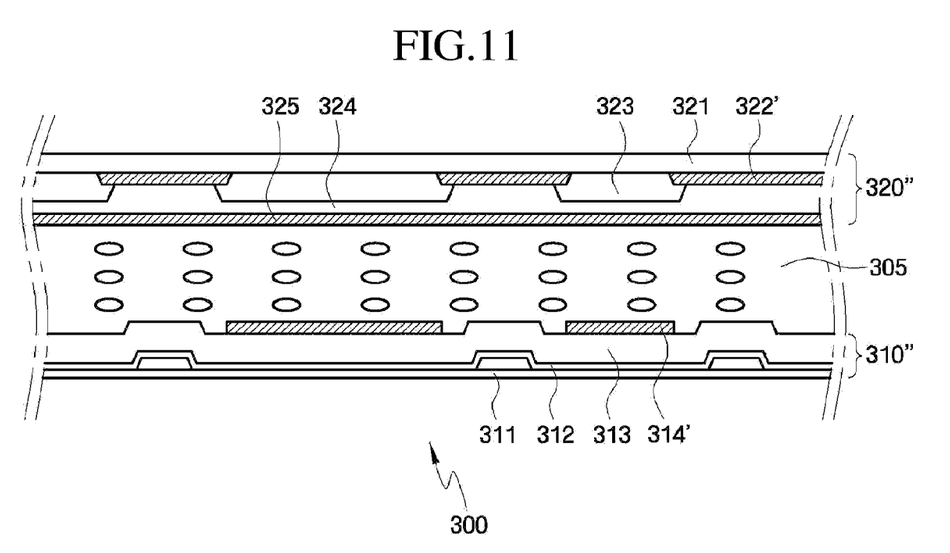
FIG. 11 is a sectional view taken along line XI-XI' of FIG. 10.

A liquid crystal display 10 according to another exemplary embodiment of the present invention will be described hereinafter in further detail with reference to FIGS. 10 and 11. FIG. 10 is a layout of the liquid crystal display 10 according to another exemplary embodiment of the present invention. FIG. 11 is a sectional view taken along line XI-XI' of FIG. 10.

In the liquid crystal display 10 according to another exemplary embodiment of the present invention, a gap of the first and the n-th lines $G_1$ to $G_n$, which is formed on the first display panel 310, may be adjusted, so that the pixel electrode 314 is adjusted, and the aperture ratio of the first pixel line $PX_{11}$ to $PX_{1m}$ is adjusted.

In order to reduce the size of the first pixel line $PX_{11}$ to $PX_{1m}$ to less than the size of the second to the n-th line $PX_{21}$ to $PX_{nm}$, a gap between the non-display area PA and the first gate line G1 may be formed smaller than a gap of each gate line $G_2$ to $G_n$. Accordingly, the pixel electrode 314' of the first pixel line $PX_{11}$ to $PX_{1m}$ may be reduced, so that the size of the pixel electrode 314' is optimized, and the aperture ratio of the first pixel line $PX_{11}$ to $PX_{1m}$, may be reduced. That is, as described above, the size of the first pixel line PX11 to PX1m should be reduced, and the pixel area PX is defined by gate lines G1 to Gn, so if the gap of each gate line G1 to Gn and data line D1 to Dm is adjusted, the size of each pixel area is changed. Hence, the liquid crystal display according to the embodiment adjusts the size of the first pixel line PX11 to PX1m by adjusting the gap of the first gate line to the nth gate line (G1 to Gn).

Further, the black matrix 322' and the color filter 323 are formed on the second insulating substrate 321. Here, the sizes of the black matrix 322' and the color filter 323 which correspond to the first pixel line $PX_{11}$ to $PX_{1m}$, are formed to fit the size of the pixel electrode 314' of the first pixel line $PX_{11}$ to $PX_{1m}$. The common electrode 325 is formed on the black matrix 322' and the color filter 323, so that the second display panel 320 is formed.

Figure 12:
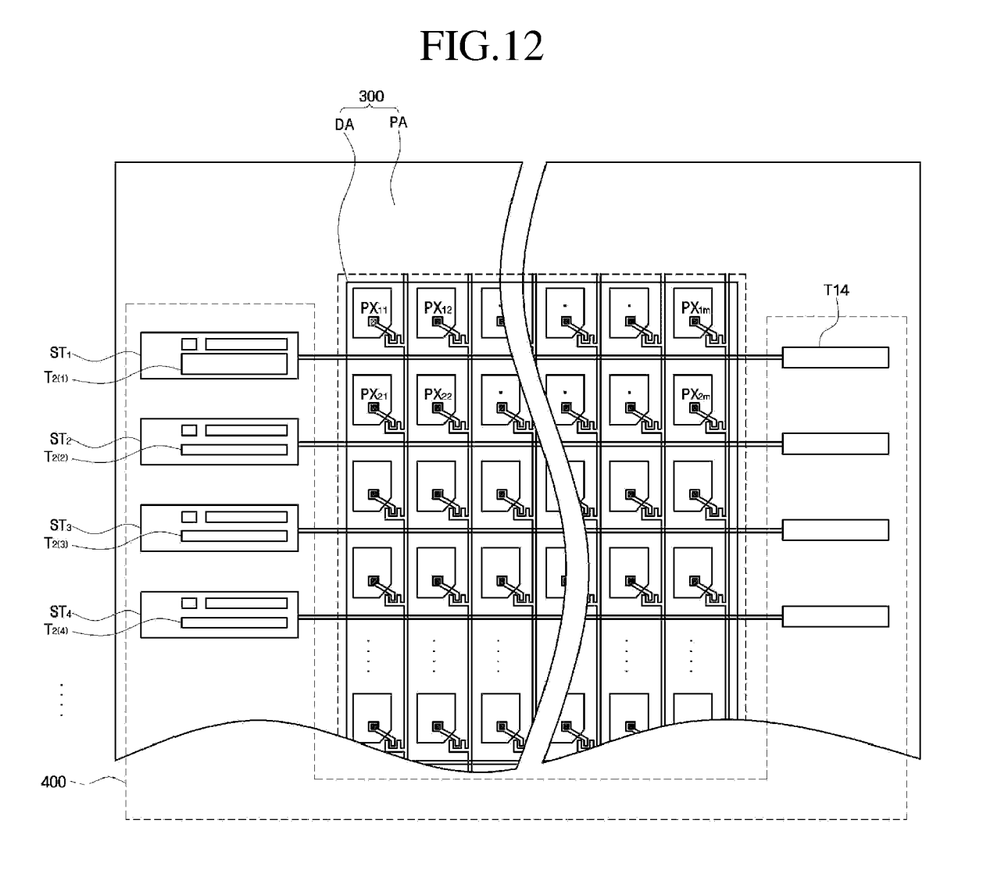
FIG. 12 is another exemplary embodiment of a layout of the liquid crystal display according to the present invention.

A liquid crystal display 10 according to another exemplary embodiment of the present invention will be described hereinafter in further detail with reference to FIG. 12. FIG. 12 is a layout of the liquid crystal display according to another exemplary embodiment of the present invention.

The liquid crystal display 10 according to another exemplary embodiment of the present invention includes the gate driver 400 which has the first to n-th stages ST1 to STn. The first pull-down transistor T2(1) of the first stage ST1 may be larger than the first pull-down transistor T2(2) to T2(n) of the second to the n-th stages ST2 to STn, so that the voltage level of the first pixel line PX11 to PX1m is decreased rapidly. Therefore, although the aperture ratio of the first pixel line PX11 to PX1m is not adjusted, the quality of the luminance is improved. In the current exemplary embodiment, the ratio of the width to the length of the channel of the first pull-down transistor T2(1) of the first stage ST1 is approximately 2 to 5 times as large as the ratio of the width to the length of the channel of the each first pull-down transistor T2(2) to T2(n) of the second to n-th stages ST2 to STn. Further, the ratio of the width to the length of the channel of the second pull-down transistor T14(1) of the first stage ST1 is approximately 0.8 to 3 times as large as the ratio of the width to the length of the channel of the first pull-down transistor T2(1) of the first stage ST1.

In order to increase the ratio of the width to the length of the channel of the first pull-down transistor T2(1) of the first stage ST1, various methods may be used such as increasing the prominence-and-depression unit (see FIGS. 6 and 7) of the first stage ST1 or enlarging the width to the length of the channel of each prominence-and-depression unit 441 and 441'.

While the present invention has been shown and described with reference to some exemplary embodiments thereof, it should be understood by those of ordinary skill in the art that various changes in form and details may be made therein without departing from the spirit and scope of the present invention as defined by the appending claims.

What is claimed is:

1. A liquid crystal display comprising:
   a liquid crystal panel comprising:
      a first display panel having first to n-th gate lines (n>2) and a plurality of data lines crossing the first to the n-th gate lines and forming a pixel, and
      a second display panel disposed to face the first display panel, an aperture ratio of a first pixel line electrically connected to the first gate line is smaller than an aperture ratio of a second to a n-th pixel line electrically connected to the second to the n-th gate line, respectively; and
   a gate driver comprising first and the second pull-down transistors which decrease a voltage of each gate line to a low level, the first and the second pull-down thin film transistors are connected to a start terminal and an end terminal of the each gate line, respectively,
   a width-to-length ratio of a channel of the second pull-down thin film transistor is approximately 0.8 to 3 times as large as a width-to-length ratio of a channel of the first pull-down thin film transistor.

2. The liquid crystal display of claim 1, wherein the gate driver comprises a first to n-th stages (n>2) which supplies a first to a n-th gate signal to the first to the n-th gate lines, respectively,
   the first to the n-th stages having the first and the second pull-down thin film transistor, respectively,
   a width-to-length ratio of the channel of the second pull-down thin film transistor of the first stage is less than a width-to-length ratio of the channel of the second pull-down thin film transistor of the second to n-th stages.

3. The liquid crystal display of claim 2, wherein the first-pull down transistor of the first stage is larger than the first pull-down transistor of the second to the n-th stages such that a voltage level of the first pixel line is decreased rapidly.

4. The liquid crystal display of claim 1, wherein the first display panel further comprises a black matrix overlapping with the first pixel line more than with the second to the n-th pixel lines.

5. The liquid crystal display of claim 4, wherein the black matrix comprises a stripe shape crossing the first pixel line.

6. The liquid crystal display of claim 1, wherein the second display panel further comprises a black matrix overlapping with the first pixel line more than with the second to the n-th pixel lines.

7. The liquid crystal display of claim 1, wherein a pixel of the first pixel line is smaller than a pixel of the second to n-th pixel line.

8. The liquid crystal display of claim 7, wherein a pixel electrode of the first pixel line is smaller than a pixel electrode of the second to n-th pixel line.

9. The liquid crystal display of claim 8, wherein a length of the pixel electrode of the first pixel line measured along a direction substantially parallel to the data lines is shorter than that of the pixel electrode of the second to n-th pixel line.

10. The liquid crystal display of claim 7, wherein a gap between a non-display area of the liquid crystal panel and the first gate line is formed smaller than a gap of each second to the n-th gate line such that a size of the first pixel line is less than a size of the second to the n-th pixel line.

11. The liquid crystal display of claim 1, wherein the aperture ratio of the first pixel line is approximately 30 to 90 percent that of the aperture ratio of the second to n-th pixel lines.

12. The liquid crystal display of claim 11, wherein the aperture ratio of the first pixel line is approximately 30 to 50 percent that of the aperture ratio of the second to the n-th pixel line, when dots per inch of the pixel is less than approximately 110.

13. The liquid crystal display of claim 11, wherein the aperture ratio of the first pixel line is approximately 50 to 90 percent that of the aperture ratio of the second to the n-th pixel line, when dots per inch of the pixel is more than approximately 110.

14. A liquid crystal display comprising:
a liquid crystal panel comprising:
a first display panel comprising first to n-th gate lines (n>2) and a plurality of data lines crossing the first to n-th gate lines and forming a pixel, and
a second display panel disposed to face the first display panel; and
a gate driver comprising a first to n-th stages which supplies a first to n-th gate signals (n>2) to first to n-th gate lines (n>2), respectively, the first to the n-th stages respectively comprise a first and a second pull-down thin film transistor which decrease the voltages of the first to n-th gate lines to a low level, each first pull-down thin film transistor is connected to a start terminal of the first to the n-th gate lines, and each second pull-down thin film transistor is connected to an end terminal of the first to the n-th gate lines,
a width-to-length ratio of a channel of the first pull-down thin film transistor of the first stage is approximately 2 to 5 times as large as a width-to-length ratio of a channel of the each first pull-down thin film transistor of the second to n-th stages.

15. The liquid crystal display of claim 14, wherein the width-to-length ratio of a channel of the second pull-down thin film transistor of the first stage is approximately 0.8 to 3 times as large as the width-to-length ratio of a channel of the first pull-down thin film transistor of the first stage.

16. The liquid crystal display of claim 14, wherein a gap between a non-display area of the liquid crystal panel and the first gate line is formed smaller than a gap of each second to the n-th gate line.

17. The liquid crystal display of claim 14, wherein the first-pull down transistor of the first stage is larger than the first pull-down transistor of the second to the n-th stages.

* * * * *